United States Patent [19]

Plus et al.

[11] Patent Number: 4,872,141

[45] Date of Patent: Oct. 3, 1989

[54] RADIATION HARD MEMORY CELL HAVING MONOCRYSTALLINE AND NON-MONOCRYSTALLINE INVERTERS

[75] Inventors: Dora Plus, South Bound Brook; Alfred C. Ipri, Princeton, both of N.J.

[73] Assignee: General Electric Company, Schenectady, N.Y.

[21] Appl. No.: 243,367

[22] Filed: Sep. 12, 1988

[51] Int. Cl.[4] ............ G11C 11/00; G11C 7/02; H03K 3/26; H01L 27/02
[52] U.S. Cl. .................... 365/154; 365/156; 365/53; 365/190; 357/41; 307/279
[58] Field of Search ............. 365/53, 154, 156, 190, 365/189, 189.01; 307/279; 357/41, 50, 42

[56] References Cited

U.S. PATENT DOCUMENTS

| | | | |
|---|---|---|---|
| 4,063,225 | 12/1977 | Stewart | 365/156 |
| 4,425,574 | 1/1984 | Silvestri et al. | 357/50 |
| 4,760,557 | 7/1988 | Stewart et al. | 365/154 |

OTHER PUBLICATIONS

S. D. S. Malhi et al., "Edge-Defined Self-Alignment of Submicrometer Overlaid Devices," *IEEE Electron Device Letters*, vol. EDL-5, No. 10, Oct. 1984, pp. 428–429.

K. Ochii et al., "An Ultralow Power 8K×8-Bit Full CMOS RAM with a Six-Transistor Cell," *IEEE Journal of Solid-State Circuits*, vol. SC-17, No. 5, Oct. 1982, pp. 798–803.

*Primary Examiner*—Stuart N. Hecker
*Assistant Examiner*—Melissa J. Koval
*Attorney, Agent, or Firm*—Henry I. Steckler; James C. Davis, Jr.; Paul R. Webb, II

[57] ABSTRACT

A radiation hard memory cell comprises on an insulating substrate a low output impedance inverter made of a monocrystalline semiconductor and a high output impedance inverter made of a non-crystalline semiconductor in order to save space. The semiconductor can be Si and a barrier layer can be used. A method for making the cell comprises depositing and defining active layers, making gate insulating layers on the active layers, forming gates on the insulating layers, and forming source and drain regions in the active layers. One inverter can have its active and insulating layers formed before the remaining active layer is formed. The remaining active layer can then be simultaneously formed with the gate of the one active layer.

4 Claims, 3 Drawing Sheets

4,872,141

RADIATION HARD MEMORY CELL HAVING MONOCRYSTALLINE AND NON-MONOCRYSTALLINE INVERTERS

BACKGROUND OF THE INVENTION

The present invention relates to a memory cell circuit and method for making it, and more particularly, to such a cell that is radiation hard.

It is known from U.S. Pat. No. 4,760,557, to have a memory cell comprising a pair of cross-coupled inverters, wherein one of the inverters has a much higher output impedance than the other inverter. The time constant of such a cell is relatively high so that the cell resists a change in its logic state during transient radiation. However, the high output impedance is achieved using a high length to width ratio for the transistors of one inverter. This results in a large cell area and a corresponding low memory array packing density.

It is, therefore, desirable to have a radiation hard memory cell that has a small area and a method for making same.

SUMMARY OF THE INVENTION

A memory cell in accordance with the invention comprises a first inverter having a low output impedance and comprising a monocrystalline semiconductor; and a second inverter, cross-coupled to said first inverter, said second inverter having a high output impedance and comprising a non-monocrystalline semiconductor.

A method in accordance with the invention of making a memory cell on a substrate comprises forming a first inverter by depositing and defining a monocrystalline semiconductor active layer on said substrate; forming a second inverter by depositing and defining a non-crystalline semiconductor active layer overlying said substrate; forming insulating layers over each of said semiconductor active layers; forming gates over each of said insulating layers; and forming source and drain regions in each of said semiconductor active layers.

DETAILED DESCRIPTION OF THE PREFERRED EMBODIMENTS

Figure 1:
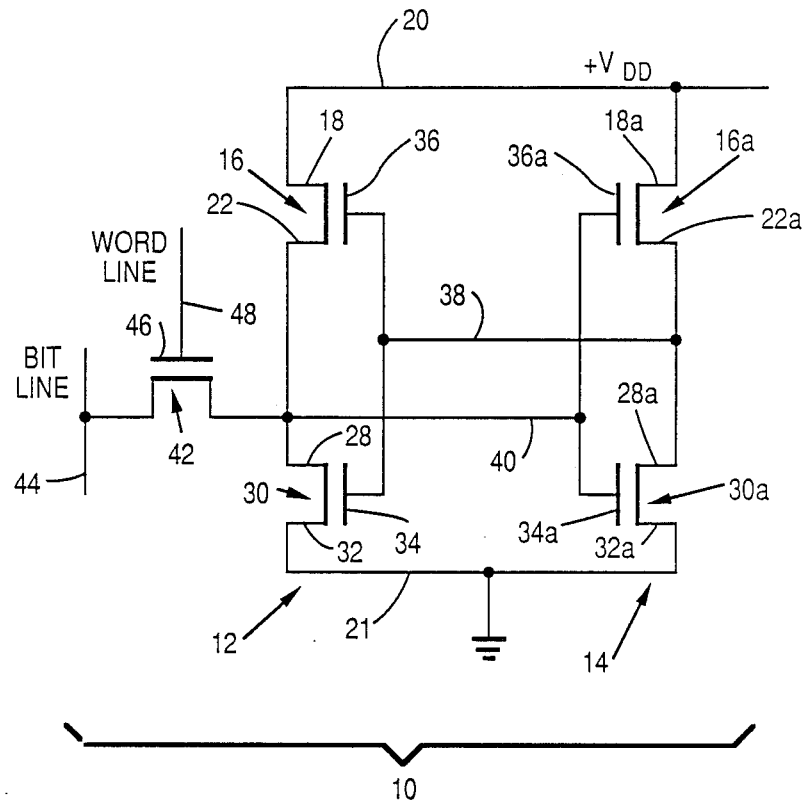
FIG. 1 is a schematic diagram of an embodiment of a circuit in accordance with the invention.

FIG. 1 shows a memory cell 10 comprising first and second cross-coupled inverters 12 and 14, respectively. In inverter 12, PMOS enhancement mode first transistor 16 has a conduction electrode or source 18 coupled to rail 20 to which a positive supply voltage, $V_{DD}$, typically between about 5 and 15 volts, is applied. A conduction electrode or drain 22 of transistor 16 is coupled to a conduction electrode or drain 28 of an NMOS enhancement-mode second transistor 30. The transistor 30 has a conduction electrode or source 32 that is coupled to a rail 21, which is grounded, and a gate electrode 34 that is coupled to a gate electrode 36 of the transistor 16. The transistors 16 and 30 comprises a monocrystalline semiconductor, e.g., m-Si, and have a typical width of about 9 μm (micrometers) and a typical length of about 3 μm so that they have a low output impedance.

The second inverter 14 shown in the right hand portion of FIG. 1, is similar to that of the first inverter 12. Corresponding reference numerals have been used on corresponding circuit elements with the suffix "a" added. However, the output impedance on a line 38 of the inverter 14 is more than about ten times larger than the output impedance on a line 40 of the inverter 12. The transistors 16a and 30a comprise a non-monocrystalline semiconductor, e.g., polycrystalline silicon (p-Si), and have a typical width of about 2 μm and a typical length of about 10 μm so that they have said high output impedance.

The gates 34 and 36 are connected to the junction of the drains 22a and 28a of transistors 16a and 30a by the line 38; the gates 34a and 36a are connected to the junction of the drains 28 and 22 by the line 40. An MOS access transistor 42 has a conduction electrode connected to the drains 22 and 28; another conduction electrode of the transistor 42 is connected to a bit line 44, and a gate 46 is connected to a word line 48.

The operation of the cell 10 is described in said patent and so will not be repeated herein. However, it is noted that as shown in said patent a pair of diodes (not shown) can be series coupled with the drains 22 and 22a, respectively, in order to provide a large voltage drop, e.g., 2 to 4 volts during transient radiation, and thus, further help prevent a change in logic state, as described further in said patent.

The output impedance of the inverter 14 is higher than that of the inverter 12 since the mobility of p-Si is about one tenth that of m-Si and p-Si has a higher threshold voltage. Further, since the desired output current of the inverter 14 is one fifth to one hundredth the desired output current of the inverter 12, and by using p-Si for the inverter 14 and m-Si for the inverter 12, the size of cell 10 can be proportionally reduced, while maintaining the same ratio of output impedances of the inverters 12 and 14 as in said patent.

Figure 2A:
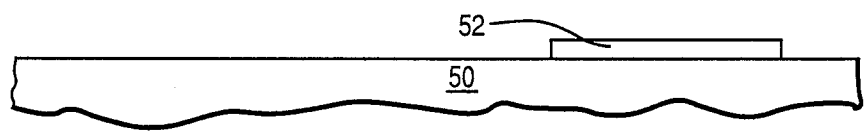
FIGS. 2a through 2f, 3a and 3b show respective embodiments of processes in accordance with the invention for making the circuit of FIG. 1.
Figure 2B:
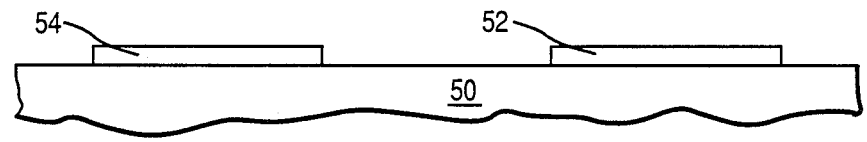
Figure 2C:
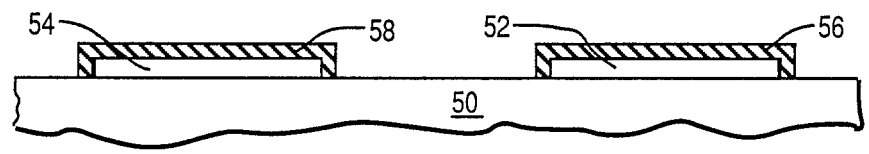
Figure 2D:
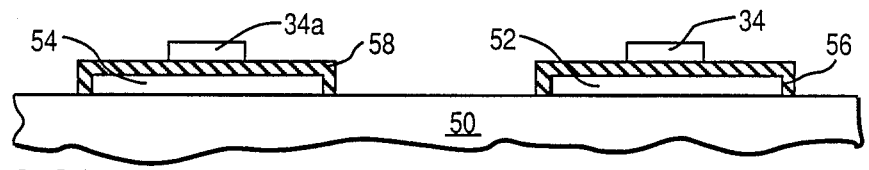
Figure 2E:
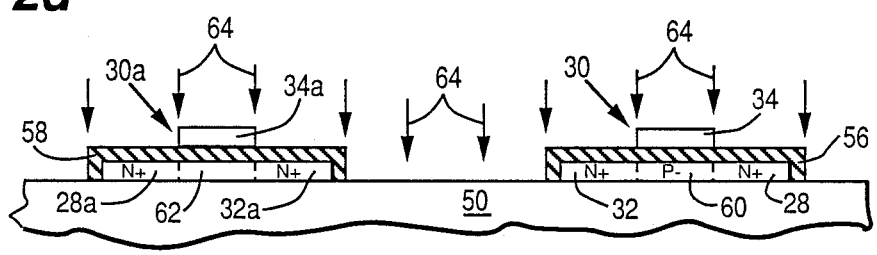

One embodiment of a process for making the N-channel transistors 30 and 30a is shown in FIGS. 2(a)–2(f). The fabrication of the P-channel transistors can be done simultaneously with opposite conductivity type dopants and appropriate masking, all as known in the art. In FIG. 2(a), on an insulating substrate 50, e.g., sapphire ($Al_2O_3$), spinel, etc. is deposited by pyrolitic decomposition of $SiH_4$ between about 850° to 1050° C. a crystalline semiconductor, e.g., m-Si, layer (not shown) having a thickness between about 0.1 to 0.5 μm and with an appropriate amount of P-conductivity type dopant, e.g., B, to achieve a doping density of about $5 \times 10^{16}$ cm$^{-3}$. Thereafter, the layer is defined to form the active layer 52. Then, as shown in FIG. 2(b) a p-Si active layer 54 is deposited and defined by pyrolitic decomposition of $SiH_4$ between about 550° to 620° C. with a thickness between about 0.1 to 0.5 μm. In FIG. 2(c) gate insulating layers 56 and 58, e.g., $SiO_2$, are grown on the layers 52 and 54, respectively, using steam at about 800° C. for about 50 minutes with a thickness between about 0.3 to 0.5 μm. In FIG. 2(d) the gates 34 and 34a, e.g., p-Si, are formed over the layers 56 and 58, respectively, by pyrolitic decomposition of $SiH_4$ between about 550° to 620° C. with a thickness between about 0.3 to 0.5 μm. During the deposition, an N-conductivity type dopant, e.g., P, is used to achieve a doping level of about $10^{20}$ cm$^{-3}$. Thereafter, the gates 34 and 34a are defined using standard photolithographic techniques. As shown in FIG.

Figure 2F:
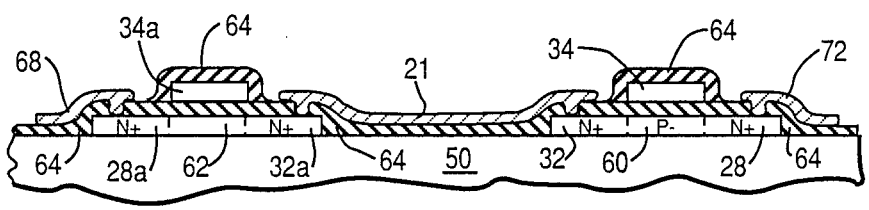

2(e), ion implantation of an N-conductivity type dopant, e.g., P, as indicated by the arrows 64 is performed at an energy of about 120 KEV and an aerial density of about $5 \times 10^{15}$ cm$^{-2}$ to achieve a doping level of about $10^{20}$ cm$^{-3}$ and also to form the drains 28 and 28a, the sources 32 and 32a, and the channels 60 and 62 therebetween of the FETs 30a and 30, respectively. FIG. 2(f) shows that an insulating layer 64, e.g., BPSG, with a thickness between about 0.5 to 1 µm is deposited at between about 300° to 500° C. Contact openings are formed in the layer 64 and conductors 21, 68, and 72, e.g., Al, are deposited and defined.

If desired, in a second embodiment of the process the layer 52 and then the layer 56 can be formed. Thereafter, the layer 54 is simultaneously formed with the gate 34 and then the gate oxide layer 58 is formed. Then the gate 34a is formed and thereafter the sources, drains, and gates formed by ion implantation. Then the BPSG layer 64 is deposited, contact openings formed, and the conductors 21, 68, and 72 deposited and defined. This embodiment has the advantage that since the gate oxide layers 56 and 58 are formed at different times, they can have different thicknesses, and thus, the transistors have different output currents for the same gate voltage. The disadvantage is that the gate 34 must be doped by implantation because active layer 54 must not be intentionally doped as deposited since then transistor 30 will always be ON.

Figure 3A:
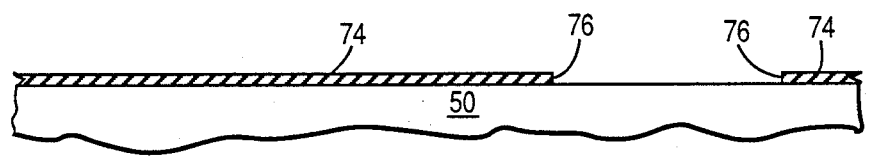
Figure 3B:
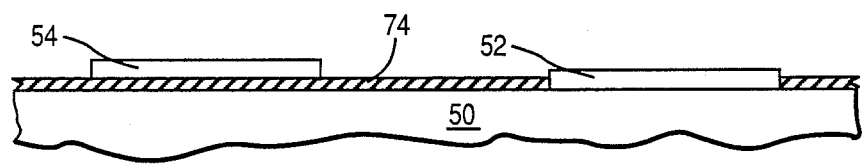

A third embodiment of the process is shown in FIGS. 3(a) and 3(b). A barrier layer 74 of an amorphous dielectric, e.g., SiO$_2$, is deposited such as by heating SH$_4$ and O$_2$ at a temperature between about 300° to 500° C. and with a maximum thickness of about 3000 Å (Angstroms). A thickness of about 1000 Å worked well. The opening 76 is then defined in the layer 74. Thereafter, the p-Si layer 54 and the m-Si layer 52 are formed by pyrolitic decomposition of SiH$_4$ at a temperature between about 850° to 1050° C. Since the layer 52 is in contact with the sapphire substrate 50, it will form as heteroepitaxial m-Si, while since the layer 54 is not in contact with the substrate 50, it will form as p-Si, both typically undoped when initially formed. The remaining steps are as shown in FIG. 2(c) to FIG. 2(f). The layer 74 also provides a barrier to photocurrents generated in the substrate 50, and therefore, such currents cannot enter the p-Si layer 54 to cause a change in logic state.

It will, therefore, be appreciated that a radiation hard memory cell having a small size and a process for making it are achieved by the present invention.

It will be further appreciated that semiconductors other than Si, e.g., Ge, GaAs, InP, etc., can be used. Also, a semiconductor substrate 50, e.g., those given above and Si, can be used instead of an insulating substrate. The non-crystalline state can be amorphous instead of polycrystalline.

What is claimed is:

1. A memory cell comprising:
   a first inverter having a low output impedance and comprising a pair of field effect transistors each having source, drain, and channel regions of a monocrystalline semiconductor; and
   a second inverter, cross-coupled to said first inverter, said second inverter having a high output impedance and comprising a pair of field effect transistors each having source, drain and channel regions of a non-monocrystalline semiconductor, wherein the area occupied by the second inverter having a high output impedance is smaller than the area occupied by the first inverter having a low output impedance.

2. The memory cell of claim 1 wherein said non-monocrystalline semiconductor comprises a polycrystalline semiconductor.

3. The memory cell of claim 1 wherein each of said semiconductors comprises silicon.

4. The memory cell of claim 1 further comprising a substrate means for supporting said inverters disposed proximate said inverters, and an insulating barrier layer disposed between said second invertor and said substrate.

* * * * *